(12) United States Patent
Murata et al.

(10) Patent No.: US 11,538,658 B2
(45) Date of Patent: Dec. 27, 2022

(54) THETA STAGE MECHANISM AND ELECTRON BEAM INSPECTION APPARATUS

(71) Applicant: NuFlare Technology, Inc., Yokohama (JP)

(72) Inventors: Takahiro Murata, Zushi (JP); Toshikatsu Akiba, Kisarazu (JP); Yoshihiro Izumi, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/446,188

(22) Filed: Aug. 27, 2021

(65) Prior Publication Data
US 2022/0076916 A1 Mar. 10, 2022

(30) Foreign Application Priority Data
Sep. 4, 2020 (JP) .............................. JP2020-148731

(51) Int. Cl.
*H01J 37/20* (2006.01)
*H01J 37/28* (2006.01)
*G01N 23/2251* (2018.01)

(52) U.S. Cl.
CPC .......... *H01J 37/20* (2013.01); *G01N 23/2251* (2013.01); *H01J 37/28* (2013.01); *H01J 2237/20214* (2013.01); *H01J 2237/2806* (2013.01); *H01J 2237/2817* (2013.01)

(58) Field of Classification Search
CPC .. H01J 37/00; H01J 37/02; H01J 37/20; H01J 37/26; H01J 37/28; H01J 37/261; H01J 37/16; H01J 2237/20214; H01J 2237/2806; H01J 2237/2817; G01N 23/2251; G01N 23/2204; G01N 2223/079; G01N 2223/307; G01N 2223/3307; G01N 2223/646
USPC .......................................... 250/306, 307, 311
See application file for complete search history.

(56) References Cited

U.S. PATENT DOCUMENTS

| | | | | |
|---|---|---|---|---|
| 4,587,431 A | * | 5/1986 | Uemura | B82Y 15/00 250/442.11 |
| 5,301,778 A | * | 4/1994 | Haeussinger | B60B 27/023 301/105.1 |
| 5,412,180 A | * | 5/1995 | Coombs, III | H01J 37/20 219/385 |
| 9,684,014 B2 | | 6/2017 | Akiyama et al. | |

FOREIGN PATENT DOCUMENTS

JP 2015-153860 A 8/2015

OTHER PUBLICATIONS

Taiwanese Office Action dated Aug. 12, 2022, issued in Taiwanese Patent Application No. 110132682 (with English translation).

* cited by examiner

*Primary Examiner* — Jason L McCormack
(74) *Attorney, Agent, or Firm* — Oblon, McClelland, Maier & Neustadt, L.L.P.

(57) ABSTRACT

According to one aspect of the present invention, a θ stage mechanism includes a fixed shaft; a plurality of bearings in which outer rings roll on an outer peripheral surface of the fixed shaft; a plurality of cylindrical members supported in a state of being inserted inside inner rings of the plurality of bearings; and a table that is arranged on the plurality of cylindrical members and moves in a rotational direction about a center of the fixed shaft by the plurality of bearings rolling on an outer peripheral surface of the fixed shaft.

10 Claims, 10 Drawing Sheets

THETA STAGE MECHANISM AND ELECTRON BEAM INSPECTION APPARATUS

CROSS-REFERENCE TO RELATED APPLICATION

This application is based upon and claims the benefit of priority from prior Japanese Patent Application No. 2020-148731 filed on Sep. 4, 2020 in Japan, the entire contents of which are incorporated herein by reference.

BACKGROUND OF THE INVENTION

Field of the Invention

One aspect of the present invention relates to a θ stage mechanism and an electron beam inspection apparatus. For example, it relates to an inspection apparatus that performs inspection using a secondary electron image of a pattern emitted by irradiating a substrate with multiple beams of the electron beam, and a θ stage mechanism mounted on the inspection apparatus.

Related Art

In recent years, circuit linewidths required for semiconductor elements have been getting narrower as large-scale integrated circuits (LSI) have become highly integrated and have larger capacities. Improvement of yield is essential for the manufacture of LSI requiring a large manufacturing cost. However, a pattern constituting the LSI is reaching an order of 10 nanometers or less, and a dimension to be detected as a pattern defect is extremely small. Therefore, there is a need to improve the accuracy of a pattern inspection apparatus that inspects defects of an ultrafine pattern transferred onto a semiconductor wafer. In addition, a pattern defect of a mask used for exposure and transfer of an ultrafine pattern on a semiconductor wafer by photolithography is one of the major factors for lowering the yield. Therefore, there is a need to improve the accuracy of a pattern inspection apparatus that inspects defects of a transfer mask used for LSI manufacturing.

As a defect inspection method, there is known a method of performing inspection by using an electron beam to compare a measurement image obtained by imaging a pattern formed on a substrate such as a semiconductor wafer or a lithography mask with a design image of design data or a measurement image obtained by imaging the same pattern on the substrate.

Here, in order to correct a conveyance error of the target object conveyed onto the stage, a θ stage function movable in the rotational direction is mounted on the stage. The conventional θ stage has a structure in which the inner ring of the bearing is supported by a center shaft on a stationary side, and the table connected to the outer ring side of the bearing is rotated. In order to support such a table, the bearing size becomes large, and accordingly the play (so-called backlash) of the bearing becomes large. As a result, there is a problem that the maximum displacement amount of the target object caused by the inclination of the target object placed on the table may become large. In order to suppress the maximum displacement amount of the target object surface, supporting the table with a bearing of multiple stages is one option. However, as the number of stages of bearings increases, the length of the center shaft needs to be lengthened, which causes a problem that the height dimension of the θ stage becomes too large. Such a problem is not limited to the case of being mounted on the inspection apparatus. A similar problem can occur in the θ stage in general in which the target object needs to be rotated.

On the other hand, in a stage on which a target object to be irradiated with an electron beam is mounted, a bearing made of a nonmagnetic material is required in order to reduce the influence of the magnetic field on the electron beam. However, a bearing made of a nonmagnetic material has a size limitation, and a large size product is not commercially available. Therefore, the bearing size is limited even when mounted on the conventional θ stage. Alternatively, it is necessary to manufacture a particularly large bearing, which causes a problem of an increase in cost.

A configuration is disclosed in which a small-sized roller is arranged on the outer periphery of the target object so as to surround the target object, and the roller is rotated to rotate the target object inside the surrounding (e.g., see JP-A-2015-153860).

BRIEF SUMMARY OF THE INVENTION

According to one aspect of the present invention, a θ stage mechanism includes:
a fixed shaft;
a plurality of bearings in which outer rings roll on an outer peripheral surface of the fixed shaft;
a plurality of cylindrical members supported in a state of being inserted inside inner rings of the plurality of bearings; and
a table that is arranged on the plurality of cylindrical members and moves in a rotational direction about a center of the fixed shaft by the plurality of bearings rolling on an outer peripheral surface of the fixed shaft.

According to another aspect of the present invention, an electron beam inspection apparatus includes:
a θ stage mechanism including
a fixed shaft;
a plurality of bearings in which outer rings roll on an outer peripheral surface of the fixed shaft;
a plurality of cylindrical members supported in a state of being inserted inside inner rings of the plurality of bearings; and
a table that is arranged on the plurality of cylindrical members and moves in a rotational direction about a center of the fixed shaft by the plurality of bearings rolling on an outer peripheral surface of the fixed shaft;
an electron beam column configured to irradiate a substrate arranged on the θ stage mechanism with an electron beam;
a detector configured to detect a secondary electron emitted from the substrate by irradiation of the electron beam; and
a comparison circuit configured to compare an inspected image with a reference image, a secondary electron image based on detected data being used as the inspected image.

DETAILED DESCRIPTION OF THE INVENTION

Hereinafter, in an embodiment, a description will be given regarding a θ stage mechanism capable of reducing the maximum displacement amount of a target object surface mounted on a table and an apparatus mounted with the θ stage mechanism.

In the following embodiment, an electron beam inspection apparatus will be described as an example of the inspection apparatus. However, the inspection apparatus is not limited thereto. The inspection apparatus may be, for example, an inspection apparatus that irradiates an inspected substrate with ultraviolet rays and acquires an inspected imaged using light reflected from the inspected substrate. In the embodiment, an inspection apparatus that acquires an image using multiple beams by a plurality of electron beams will be described, but the inspection apparatus is not limited thereto. The inspection apparatus may be an inspection apparatus that acquires an image using a single beam by one electron beam. The apparatus mounted with the stage mechanism described below is not limited to an inspection apparatus, and may be any apparatus mounted with a θ stage movable in a rotational direction. For example, the present invention can also be applied to a writing apparatus.

Embodiment 1.

Figure 1:
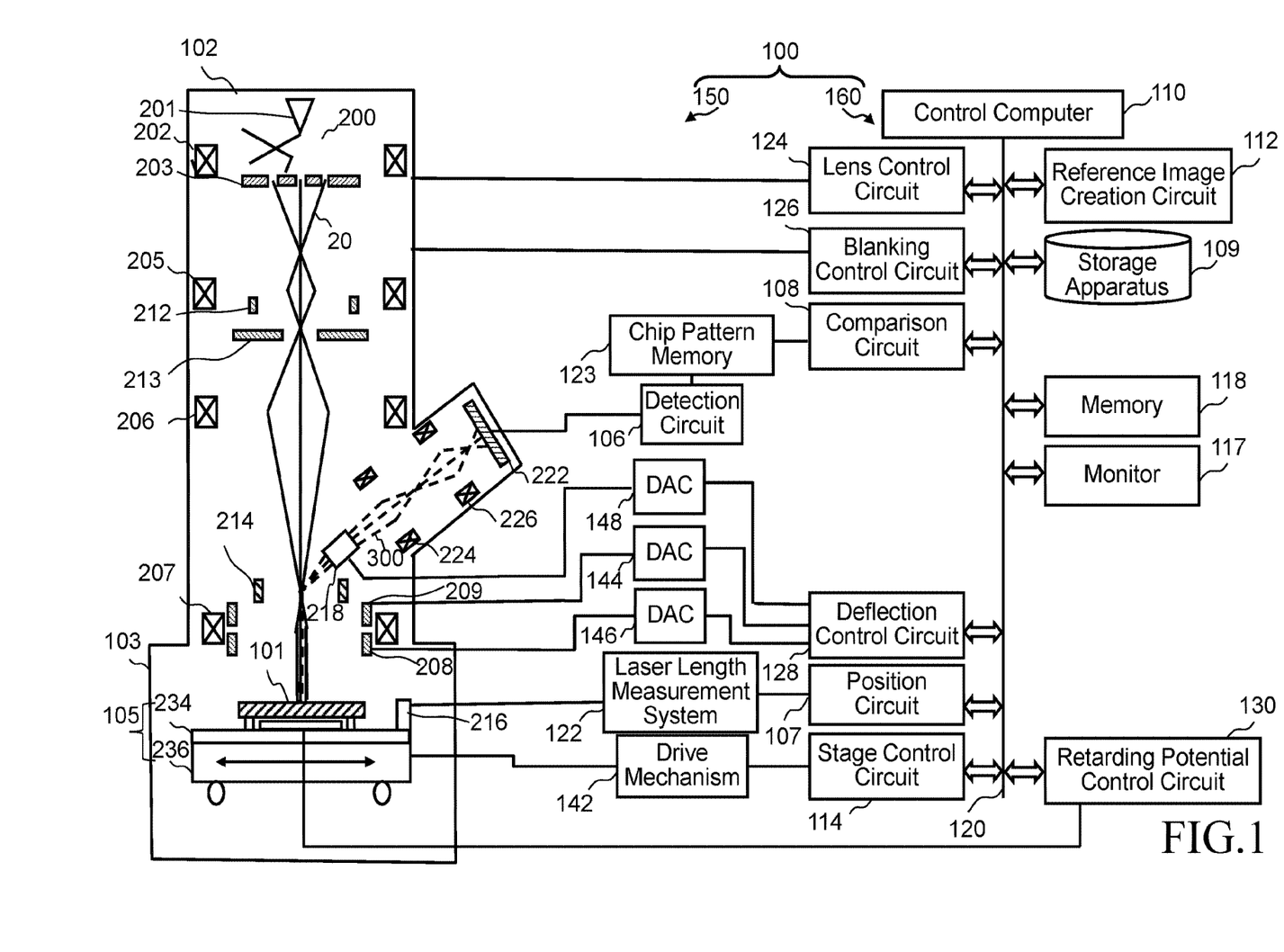
FIG. 1 is a configuration view showing an example of the configuration of an inspection apparatus in Embodiment 1.

FIG. 1 is a configuration view showing an example of the configuration of an inspection apparatus in Embodiment 1. In FIG. 1, an inspection apparatus 100 that inspects a pattern formed on a substrate is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, an electron gun assembly 201, an electromagnetic lens 202, a shaping aperture array substrate 203, an electromagnetic lens 205, a collective blanking deflector 212, a limiting aperture substrate 213, an electromagnetic lens 206, an electromagnetic lens 207 (objective lens), a main deflector 208, a sub-deflector 209, a beam separator 214, a deflector 218, an electromagnetic lens 224, an electromagnetic lens 226, and a multi-detector 222 are arranged. In the example of FIG. 1, the electron gun assembly 201, the electromagnetic lens 202, the shaping aperture array substrate 203, the electromagnetic lens 205, the collective blanking deflector 212, the limiting aperture substrate 213, the electromagnetic lens 206, the electromagnetic lens 207 (objective lens), the main deflector 208, and the sub-deflector 209 constitute a primary electron optics that irradiates a substrate 101 with multiple primary electron beams. The beam separator 214, the deflector 218, the electromagnetic lens 224, and the electromagnetic lens 226 constitute a secondary electron optics that irradiates the multi-detector 222 with multiple secondary electron beams.

In the inspection chamber 103, a stage 105 movable at least in the XY directions is arranged. In the stage 105, a θ stage 234 movable in the rotational direction is arranged on an XY stage 236 movable in the XY direction. On the θ stage 234, the substrate 101 (target object) to be inspected is arranged. Here, the substrate 101 is supported on the θ stage 234 by three-point support, for example. The substrate 101 includes an exposure mask substrate and a semiconductor substrate such as a silicon wafer. In a case where the substrate 101 is a semiconductor substrate, a plurality of chip patterns (wafer dies) are formed on the semiconductor substrate. In a case where the substrate 101 is an exposure mask substrate, a chip pattern is formed on the exposure mask substrate. The chip pattern includes a plurality of figure patterns. By exposing and transferring, a plurality of times, the chip pattern formed on such the exposure mask substrate onto the semiconductor substrate, the plurality of chip patterns (wafer dies) are formed on the semiconductor substrate. Hereinafter, a case where the substrate 101 is a semiconductor substrate will be mainly described. The substrate 101 is arranged on the stage 105 with the pattern formation surface facing upward, for example. On the stage 105, a mirror 216 that reflects laser light for laser length measurement with which a laser length measurement system 122 irradiates arranged outside the inspection chamber 103 is arranged. The multi-detector 222 is connected to a detection circuit 106 outside the electron beam column 102.

In the control system circuit 160, a control computer 110 that controls the entire inspection apparatus 100 is connected via a bus 120 to a position circuit 107, a comparison circuit 108, a reference image creation circuit 112, a stage control circuit 114, a lens control circuit 124, a blanking control circuit 126, a deflection control circuit 128, a retarding potential control circuit 130, a storage apparatus 109 such as a magnetic disk drive, a monitor 117, and a memory 118. The deflection control circuit 128 is connected to digital-analog conversion (DAC) amplifiers 144, 146, and 148. The DAC amplifier 146 is connected to the main deflector 208, and the DAC amplifier 144 is connected to the sub-deflector 209. The DAC amplifier 148 is connected to the deflector 218.

The detection circuit 106 is connected to a chip pattern memory 123. The chip pattern memory 123 is connected to the comparison circuit 108. The stage 105 is driven by a drive mechanism 142 under the control of the stage control circuit 114. In the drive mechanism 142, a drive system such as a dual-axis (X-Y) motor that drives in the X direction and the Y direction in the stage coordinate system, for example, is configured, and the XY stage 236 is movable in the XY direction. A single-axis drive motor (θ motor) is arranged as described later near the θ stage 234, and the θ stage 234 is movable in a rotation (θ) direction by driving a tapered block. As these X motor and the Y motor not illustrated, for example, a stepping motor can be used. As the θ motor not illustrated, for example, a piezoelectric drive ultrasonic motor is preferably used. The stage 105 is movable in the horizontal direction and the rotational direction by the motor of each of XYθ axes. The movement position of the stage 105 is measured by the laser length measurement system 122 and supplied to the position circuit 107. The laser length measurement system 122 measures the position of the stage 105 on the principle of laser interferometry by receiving reflected light from the mirror 216. In the stage coordinate system, for example, the X direction, the Y direction, and the θ direction are set with respect to a plane orthogonal to the optical axis (electron orbit center axis) of the multiple primary electron beams.

The electromagnetic lens 202, the electromagnetic lens 205, the electromagnetic lens 206, the electromagnetic lens 207 (objective lens), the electromagnetic lens 224, the electromagnetic lens 226, and the beam separator 214 are controlled by the lens control circuit 124. Furthermore, the collective blanking deflector 212 includes two or more electrodes, and is controlled for each electrode by the blanking control circuit 126 via a DAC amplifier not illustrated. The sub-deflector 209 includes four or more electrodes, and is controlled for each electrode by the deflection control circuit 128 via the DAC amplifier 144. The main deflector 208 includes four or more electrodes, and is controlled for each electrode by the deflection control circuit 128 via the DAC amplifier 146. The deflector 218 includes four or more electrodes, and is controlled for each electrode by the deflection control circuit 128 via the DAC amplifier 148. A retarding potential controlled by the retarding potential control circuit 130 is applied to the substrate 101.

A high-voltage power supply circuit not illustrated is connected to the electron gun assembly 201. Due to application of an acceleration voltage from the high-voltage power supply circuit to between a filament (cathode) not illustrated and an extraction electrode (anode) in the electron gun assembly 201, application of a voltage of another extraction electrode (Wehnelt), and heating of the cathode at a predetermined temperature, an electron group emitted from the cathode is accelerated and emitted as an electron beam 200.

Here, FIG. 1 includes a configuration necessary for describing Embodiment 1. The inspection apparatus 100 may normally include other necessary configurations.

Figure 2:
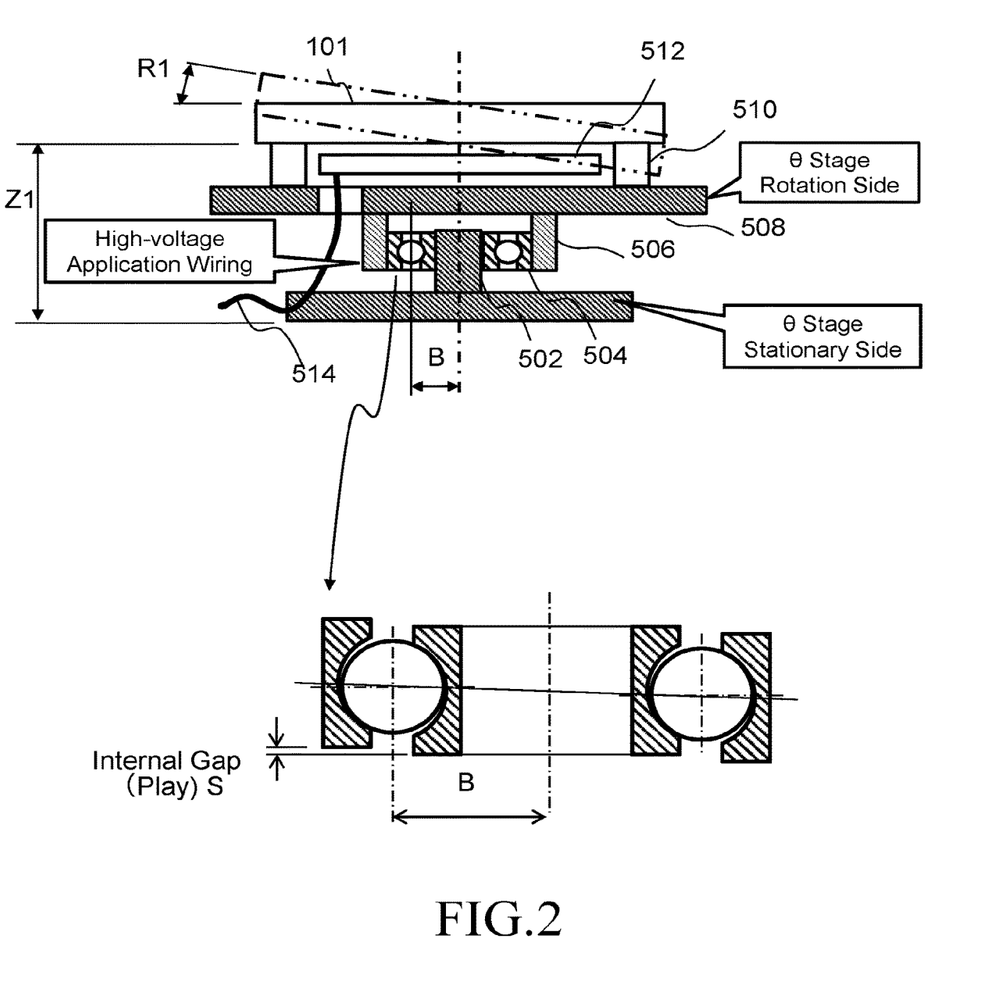
FIG. 2 is a cross-sectional view showing an example of a θ stage in Comparative Example 1 of Embodiment 1.

FIG. 2 is a cross-sectional view showing an example of the θ stage in Comparative Example 1 of Embodiment 1. In FIG. 2, in the θ stage in Comparative Example 1 of Embodiment 1, an inner ring of a bearing 504 is supported by a fixed shaft 502 on the stationary side. A table 508 on a rotation side is arranged on a rotation shaft 506 in which an outer ring of the bearing 504 is fitted to an inner peripheral surface. Three support pins 510 are arranged on the table 508, and the substrate 101, which is an object to be measured, is supported at three points by the three support pins 510. A retarding electrode 512 is arranged between the substrate 101 and the table 508, and a high-voltage application wiring 514 for applying a negative high potential for retarding potential is connected to the retarding electrode 512. In such a configuration, a value obtained by dividing an internal gap (play) S of the bearing 504 by a distance B from the rotation center to the play occurrence part corresponds to a maximum displacement amount R1 of the substrate 101 caused by the inclination of the substrate 101. In order to support loads of structures such as the rotation shaft 506, the table 508 on the rotation side, the retarding electrode 512, and the substrate 101, a bearing having a large size is required. As the size increases, an internal gap S of the bearing increases accordingly. Since the internal gap S of the bearing increases, there is a problem that the maximum displacement amount R1 of the substrate 101 caused by the inclination of the substrate 101 increases. This causes an error in the irradiation position of the electron beam, thereby making it difficult to obtain a highly accurate image. In Comparative Example 1, the high-voltage application wiring is connected to the electrode through an opening formed at a position close to the outer peripheral side of the table. Since a high potential of -several tens kV, for example, is applied to the electrode, the high-voltage application wiring is thick and difficult to bend. Therefore, there is also a problem that such high-voltage application wiring sometimes Interferes with rotational movement of the table.

Figure 3:
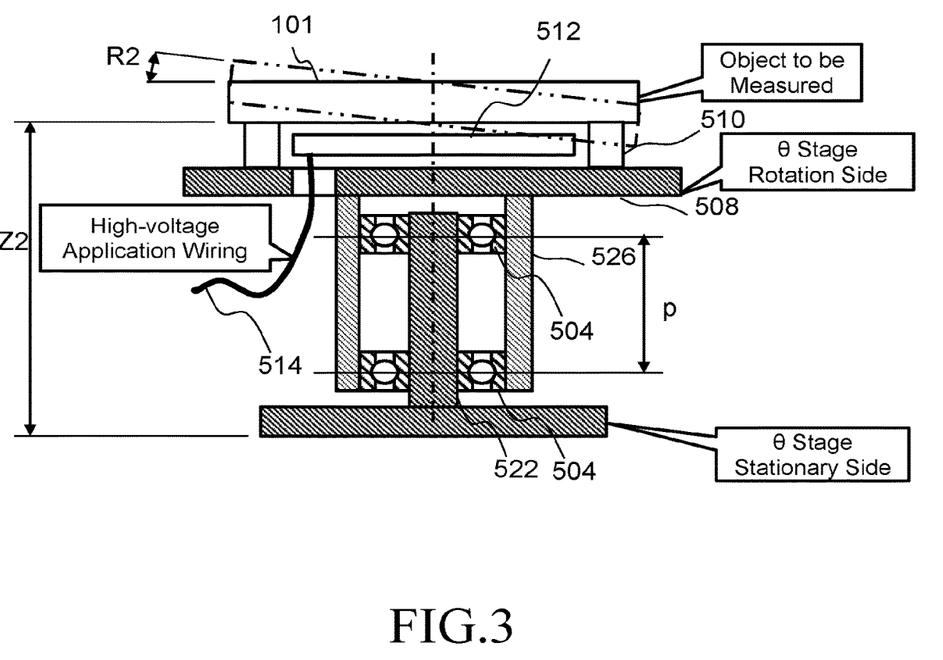
FIG. 3 is a cross-sectional view showing an example of a θ stage in Comparative Example 2 of Embodiment 1.

FIG. 3 is a cross-sectional view showing an example of the θ stage in Comparative Example 2 of Embodiment 1. FIG. 3 shows a case where, in the θ stage in Comparative Example 2 of Embodiment 1, the bearing 504 has a two-stage configuration from the configuration of Comparative Example 1. By arranging the two-stage bearing 504 on a fixed shaft 522 on the same stationary side, a value obtained by dividing the internal gap (play) S of the bearing 504 by an arrangement pitch p between the two-stage bearings corresponds to a maximum displacement amount R2 of the substrate 101 caused by the inclination of the substrate 101. On the other hand, since the fixed shaft 522 and a rotation shaft 526 are lengthened in order to arrange the two-stage bearing 504, a height dimension Z2 of the θ stage of Comparative Example 2 needs to become larger than a height dimension Z1 of the θ stage of Comparative Example 1. Here, the maximum displacement amount R2 generated in the substrate 101 in Comparative Example 2 can be reduced by increasing the arrangement pitch p. However, in order to also reduce an inclination angle to an allowable level, the height dimension Z2 of the θ stage of Comparative Example 2 becomes larger than an allowable height dimension. As a result, it becomes difficult to arrange the θ stage in an allowable space in the inspection chamber 103.

Figure 4:
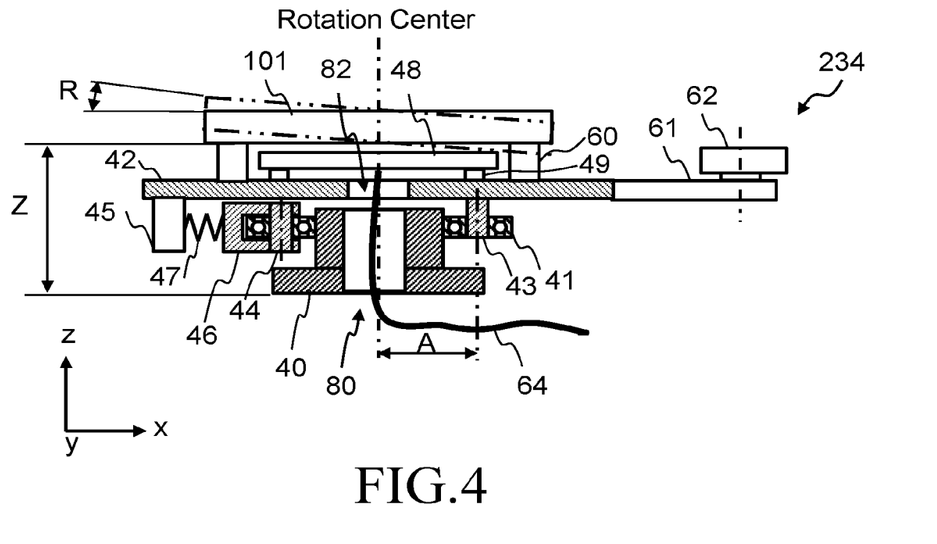
FIG. 4 is a cross-sectional view showing an example of the configuration of a θ stage in Embodiment 1.

FIG. 4 is a cross-sectional view showing an example of the configuration of the θ stage in Embodiment 1.

Figure 5:
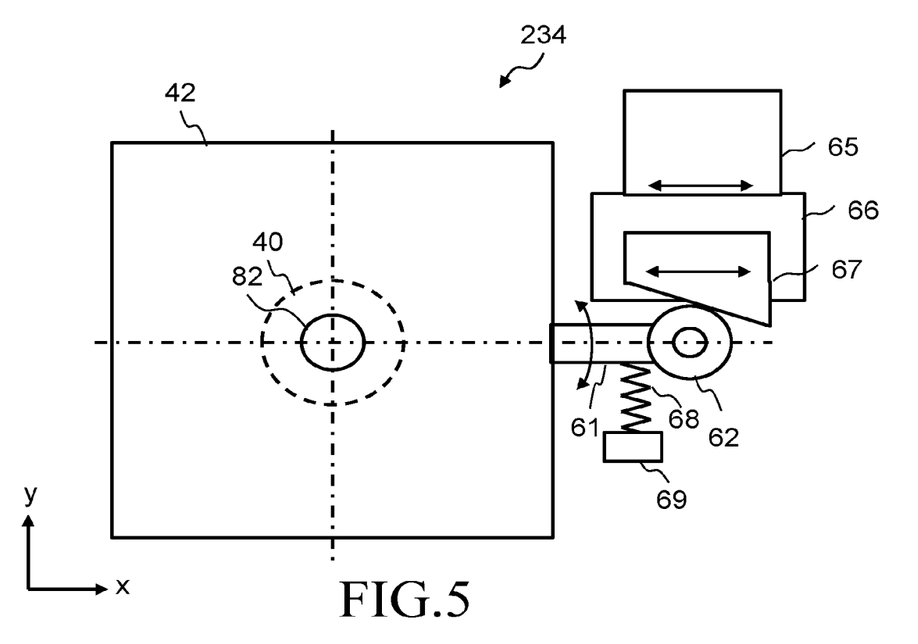
FIG. 5 is a top view showing an example of the configuration of the θ stage in Embodiment 1.

FIG. 5 is a top view showing an example of the configuration of the θ stage in Embodiment 1.

Figure 6:
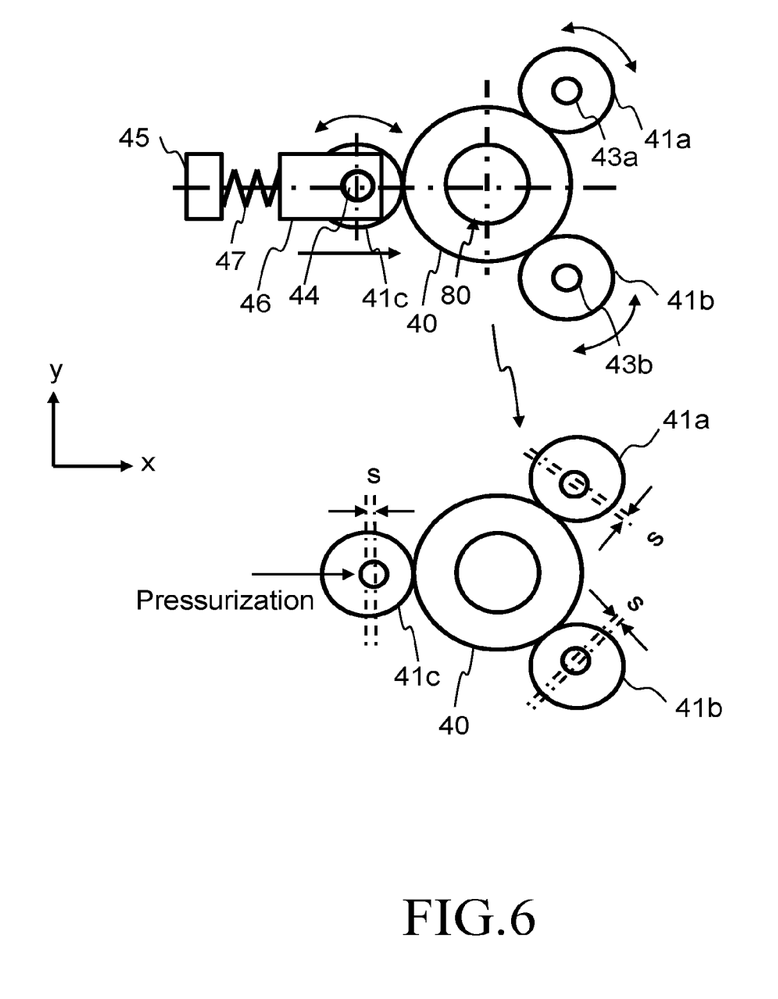
FIG. 6 is a top view showing a region where a bearing is arranged in the configuration of the θ stage in Embodiment 1.

FIG. 6 is a top view showing a region where the bearing is arranged in the configuration of the θ stage in Embodiment 1. FIG. 5 shows a case of being viewed from above the surface of a table 41. In FIGS. 4 and 5, the θ stage 234 (θ stage mechanism) in Embodiment 1 has a fixed shaft 40 on the stationary side, a plurality of bearings 41, a table 42 on the rotation side, at least one shaft 43, at least one shaft 44, at least one fixture 45, at least one bearing holder 46, at least one elastic body 47, an electrode 48, a plurality of support pins 49, a plurality of support pins 60, an arm 61, a roller 62, wiring 64, a drive motor 65 (θ motor), a tapered block holder 66, a tapered block 67, an elastic body 68, and a fixture 69. The examples of FIGS. 4 and 5 show a case where three bearings 41, two shafts 43, one shaft 44, one fixture 45, one bearing holder 46, and one elastic body 47 are arranged. However, the present invention is not limited thereto.

As shown in FIG. 6, the three bearings 41 are arranged such that the outer rings roll on the outer peripheral surface of the fixed shaft 40. It is preferable that the three bearings 41 are arranged with phases shifted equally about the center of the fixed shaft 40. In the example of FIG. 6, the three bearings 41 are arranged with phases shifted by 120°. As shown in FIGS. 4 and 6, the two shafts 43 and the one shaft 44 (a plurality of cylindrical members) are supported in a state of being inserted inside the inner rings of the three bearings 41 (a plurality of bearings). Specifically, a shaft 43a, which is one of the two shafts 43, is supported in a state of being inserted inside the inner ring of a bearing 41a. A shaft 43b, which is the other one of the two shafts 43, is supported in a state of being inserted inside the inner ring of a bearing 41b. The remaining one shaft 44 is supported in a state of being inserted inside the inner ring of a bearing 41c.

As shown in FIG. 4, the table 42 is arranged on the two shafts 43a and 43b and the one shaft 44. One or more bearings of the plurality of bearings 41 are fixed to the table 42 via a shaft inserted into the inner ring. Specifically, the upper surfaces of the two shafts 43a and 43b are connected and fixed to the rear surface of the table 42. The remaining shaft 44 is arranged with a gap from the rear surface of the table 42.

The shaft 44 is arranged in the bearing holder 46 together with the fitted bearing 41c. The fixture 45 is arranged and fixed on the radial direction line from the rotation center of the table 42 toward the shaft 44, on the rear surface of the outer peripheral portion of the table 42. The elastic body 47 is arranged in a compressed state between the fixture 45 and the bearing holder 46. As an example of the elastic body 47, a spring is preferably used. Due to the elastic force in the direction in which the elastic body 47 extends, the bearing 41c is pressurized on the outer peripheral surface side of the fixed shaft 40 via the shaft 44 in which the bearing 41c is inserted into the inner ring. Thus, as shown in FIG. 6, the inner rings of the three bearings 41 are each pressed to the center side of the rotation shaft 40, and become difficult to move freely in the internal gap. Therefore, play (so-called backlash) due to the internal gap of the three bearings 41 can be eliminated or reduced. Furthermore, it is possible to prevent a gap from being generated between the three bearings 41 and the fixed shaft 40 even when positional displacement due to the internal gap of the three bearings 41 is caused by pressurization.

As shown in FIG. 5, the arm 61 is connected to the table 42. In the example of FIG. 5, the arm 61 is connected so as to extend in the x direction from the x direction end of the table 42. The roller 62 is rotatably supported near the tip end of the arm 61. The tapered surface of the tapered block 67 having one surface formed in taper is arranged so as to abut on the roller 62. The compressed elastic body 68 is arranged between the arm 61 and the fixture 69 on the stationary side. Due to the elastic force in the direction in which the elastic body 68 extends, the roller 62 is pressed against the tapered surface of the tapered block 67 via the arm 61. As an example of the elastic body 68, a spring is preferably used.

As shown in FIG. 5, the drive motor 65 is driven in a single-axis direction. In the example of FIG. 5, the drive motor 65 is driven in the x direction, for example. When the tapered block holder 66 is moved in the x direction by the drive motor 65, the tapered block 67 supported by the tapered block holder 66 moves in the x direction. In the example of FIG. 5, the tapered block 67 moves in the −x direction to press the roller 62 in the −y direction to press the arm 61, and the outer rings of the three bearings 41 roll on the outer peripheral surface of the fixed shaft 40, whereby the table 42 moves in the clockwise rotational direction about the center of the fixed shaft 40. Inversely, when the tapered block 67 moves in the +x direction, the elastic body 68 presses the roller 62 in the +y direction to press the arm 61, and the outer rings of the three bearings 41 roll on the outer peripheral surface of the fixed shaft 40, whereby the table 42 moves in the anticlockwise rotational direction about the center of the fixed shaft 40. The range of the rotation angle that can be adjusted by the table 42 may be discretionarily set. For example, the rotation angle of the substrate 101 is adjusted within an angle range of a few degrees. For example, a rotation angle e of the substrate 101 is adjusted within a range of ±0.1°.

By using the plurality of bearings 41 and arranging the rotation center of each bearing 41 itself at a position outside different from the rotation center of the table 42, it is possible to reduce the size of each bearing 41. As described above, the play (so-called backlash) due to the internal gap of the three bearings 41 can be eliminated or reduced by the pressurization. However, even if the play (so-called backlash) due to the internal gap occurs, an internal gap s existing in each bearing 41 can be reduced, and hence the maximum displacement amount R of the substrate 101 is caused by the inclination of the substrate 101 can be reduced. In such a configuration, a value obtained by dividing the internal gap (play) s of the bearing by a distance A from the rotation center to the play occurrence part corresponds to a maximum displacement amount R of the substrate 101 caused by the inclination of the substrate 101. Since the size of the bearing 41 can be reduced, the bearing can be discretionarily selected from commercially available non-magnetic material bearings. By using the plurality of small bearings 41 to configure the rotation mechanism of the θ stage 234, it is possible to reduce a height dimension Z of the θ stage 234.

As shown in FIGS. 4 and 5, an opening 80 is formed at the center of the fixed shaft 40. In other words, the fixed shaft 40 is formed in a hollow structure. An opening 82 is formed at the center region of the table 42 including the rotation center region of the table 42. In other words, in the examples of FIGS. 4 and 5, the opening 82 is formed in a region including the rotation center of the table.

Here, the electrode 48 is arranged above the table 42 via the plurality of support pins 49. The substrate 101 is arranged above the table 42 and on the electrode 48 via the plurality of support pins 60. The substrate 101 is supported at three points near the outer peripheral portion by the three support pins 60, for example. The electrode 48 is formed in a size that can be arranged in a region surrounded by the three support pins 60. The outer size of the electrode 48 is preferably formed as large as possible in a region surrounded by the three support pins 60 so that the electrode surface size gets close to the substrate 101 as much as possible. The shape of the electrode 48 is, for example, a disk shape or a rectangular board shape. The shape of the electrode 48 desirably has a similarity shape to the shape of the substrate 101.

A negative retarding potential is applied to the substrate 101 by an electric field formed by a potential applied to the electrode 48. In order to apply a potential to the electrode 48, high-voltage application wiring is required. In Embodiment 1, the wiring 64 serving as high-voltage application wiring is connected to the rear surface of the electrode 48 from the outside through the opening 80 at the center of the fixed shaft 40 and the opening 82 at the center of the table 42. As described above, for example, since a high potential of -several tens kV, for example, is applied to the electrode 48, the wiring 64 to which a high voltage is applied is thick and difficult to bend. However, in Embodiment 1, since the wiring 64 passes through the openings 80 and 82 formed in the rotation center axis of the table 42, it is possible to avoid the wiring 64 from interfering with the rotational movement of the table 42.

Figure 7:
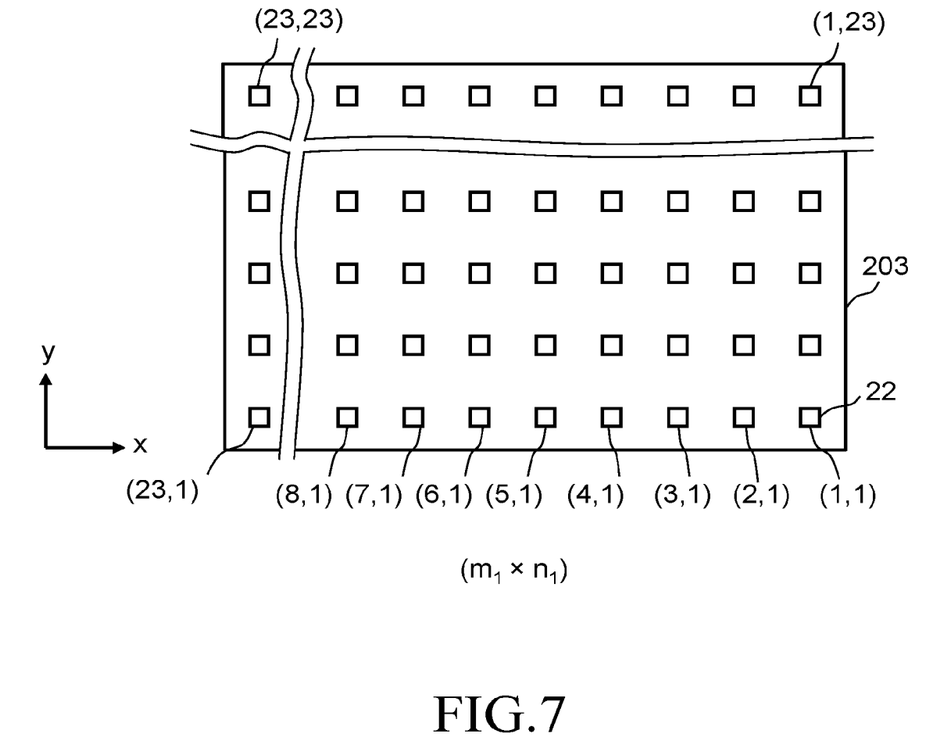
FIG. 7 is a conceptual view showing the configuration of a shaping aperture array substrate in Embodiment 1.

FIG. 7 is a conceptual view showing the configuration of the shaping aperture array substrate in Embodiment 1. In FIG. 7, on the shaping aperture array substrate 203, two-dimensional holes (openings) 22 of $m_1$ columns in width (x direction)×$n_1$ rows in length (y direction) (one of $m_1$ and $n_1$ is an integer of 2 or more and the other is an integer of 1 or more) are formed at a predetermined array pitch in the x and y directions. The example of FIG. 7 shows a case where 23×23 holes (openings) 22 are formed. Each hole 22 is ideally formed in a rectangular shape having the same dimension and shape. Alternatively, they may ideally be circular with the same outer diameter. As part of the electron beam 200 passes through each of the plurality of holes 22, $m_1 \times n_1$ (=N) multiple primary electron beams 20 are formed.

Next, the operation of the image acquisition mechanism 150 in the inspection apparatus 100 will be described.

The electron beam column 102 irradiates the substrate 101 arranged on the θ stage 234 (θ stage mechanism) with the multiple primary electron beams 20 (electron beam). Specifically, the operation is as follows. The electron beam 200 emitted from the electron gun assembly 201 (emission source) is refracted by the electromagnetic lens 202 and illuminates the entire shaping aperture array substrate 203. As shown in FIG. 7, the plurality of holes 22 (openings) are formed in the shaping aperture array substrate 203, and the electron beam 200 illuminates a region including all of the plurality of holes 22. Each part of the electron beam 200 with which the position of the plurality of holes 22 is irradiated passes through each of the plurality of holes 22 of the shaping aperture array substrate 203, whereby the multiple primary electron beams 20 are formed.

The formed multiple primary electron beams 20 are refracted by the electromagnetic lens 205 and the electromagnetic lens 206, pass through the beam separator 214 arranged at a crossover position of each beam (intermediate image position of each beam) of the multiple primary electron beam 20 while repeating the intermediate image and the crossover, and travel to the electromagnetic lens 207 (objective lens). The electromagnetic lens 207 focuses the multiple primary electron beams 20 on the substrate 101. The multiple primary electron beams 20 focused on the substrate 101 (target object) surface by the objective lens 207 are collectively deflected by the main deflector 208 and the sub-deflector 209, and the irradiation position of each beam on the substrate 101 is irradiated with the multiple primary electron beams 20. Note that, in a case where the entire multiple primary electron beams 20 are collectively deflected by the collective blanking deflector 212, the positions deviate from the hole in the center of the limiting aperture substrate 213 and are shielded by the limiting aperture substrate 213. On the other hand, the multiple primary electron beams 20 not deflected by the collective blanking deflector 212 pass through the hole in the center of the limiting aperture substrate 213 as shown in FIG. 1. Blanking control is performed by ON/OFF of the collective blanking deflector 212, and ON/OFF of beams is collectively controlled. Thus, the limiting aperture substrate 213 shields the multiple primary electron beams 20 deflected so as to be in the beam OFF state by the collective blanking deflector 212. The multiple primary electron beams 20 for inspection (for image acquisition) are formed by the beam group having passed through the limiting aperture substrate 213, the beam group having been formed from beam ON to beam OFF.

When a desired position of the substrate 101 is irradiated with the multiple primary electron beams 20, a secondary electron flux (multiple secondary electron beams 300) including reflected electrons corresponding to each beam of the multiple primary electron beams 20 is emitted from the substrate 101 due to the irradiation of the multiple primary electron beams 20.

The multiple secondary electron beams 300 emitted from the substrate 101 pass through the electromagnetic lens 207 and travel to the beam separator 214.

Here, the beam separator 214 generates an electric field and a magnetic field in directions orthogonal to each other on a plane orthogonal to the travel direction (electron orbit center axis) of the center beam of the multiple primary electron beams 20. The electric field exerts a force in the same direction regardless of the travel direction of the electrons. In contrast, the magnetic field exerts a force according to Fleming's left-hand rule. Therefore, the orientation of the force acting on the electrons can be changed depending on the entering direction of the electrons. The force due to the electric field and the force due to the magnetic field cancel each other in the multiple primary electron beams 20 entering the beam separator 214 from above, and the multiple primary electron beams 20 travel straight downward. On the other hand, in the multiple secondary electron beams 300 entering the beam separator 214 from below, both the force due to the electric field and the force due to the magnetic field act in the same direction, and the multiple secondary electron beams 300 are bent obliquely upward and separated from the multiple primary electron beams 20.

The multiple secondary electron beams 300 bent obliquely upward and separated from the multiple primary electron beams 20 are further bent by the deflector 218 and projected to the multi-detector 222 while being refracted by the electromagnetic lenses 224 and 226. The multi-detector 222 detects secondary electrons emitted from the substrate 101 by irradiation with the multiple primary electron beams 20. Specifically, the multi-detector 222 detects the projected multiple secondary electron beams 300. Reflected electrons and secondary electrons may be projected onto the multi-detector 222, or the reflected electrons may diverge in the middle and the remaining secondary electrons may be projected. The multi-detector 222 has a two-dimensional sensor. Each secondary electron of the multiple secondary electron beams 300 collides with a corresponding region of the two-dimensional sensor to generate electrons, and generate secondary electron image data for each pixel. In other words, in the multi-detector 222, a detection sensor is arranged for each primary electron beam of the multiple primary electron beams 20. The corresponding secondary electron beam emitted by the irradiation of each primary electron beam is detected. Therefore, each detection sensor of the plurality of detection sensors of the multi-detector 222 detects the intensity signal of the secondary electron beam for the image due to the irradiation of the primary electron beam in charge. The intensity signal detected by the multi-detector 222 is output to the detection circuit 106.

Figure 8:
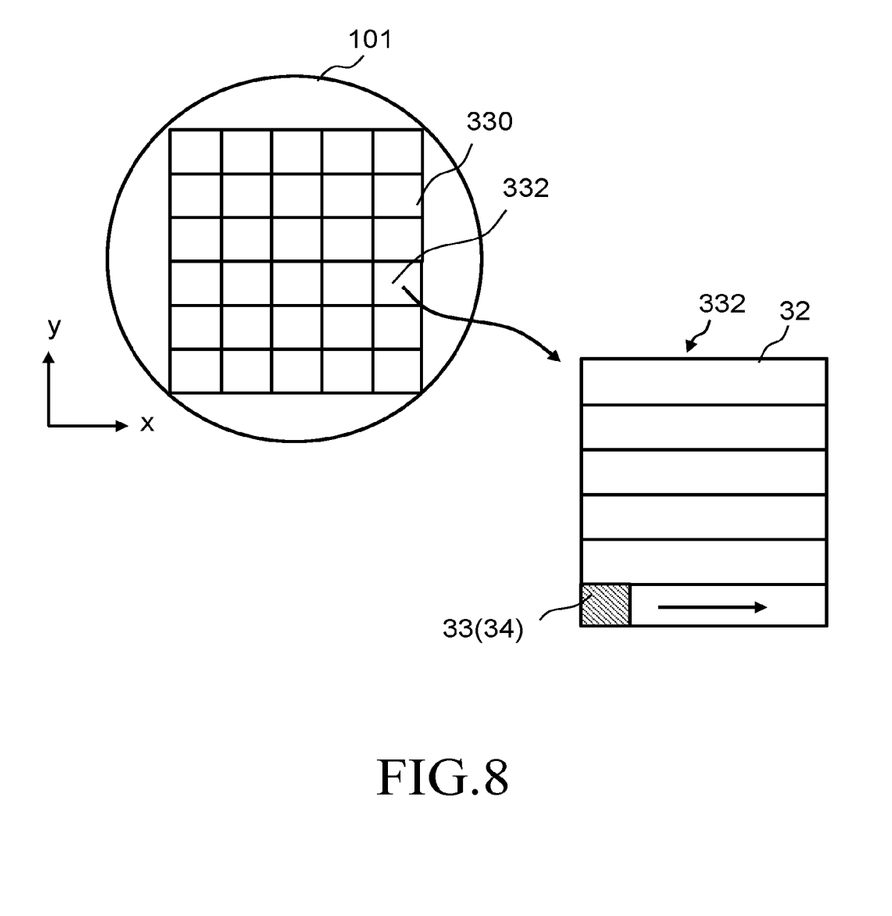
FIG. 8 is a view showing an example of a plurality of chip regions formed on a semiconductor substrate in Embodiment 1.

FIG. 8 is a view showing an example of a plurality of chip regions formed on the semiconductor substrate in Embodiment 1. In FIG. 8, in a case where the substrate 101 is a semiconductor substrate (wafer), a plurality of chips (wafer dies) 332 are formed in a two-dimensional array shape in an inspection region 330 of the semiconductor substrate (wafer). A mask pattern for one chip formed on the exposure mask substrate is reduced to, for example, ¼ and transferred to each chip 332 by an exposure apparatus (stepper, scanner, or the like) not illustrated. The region of each chip 332 is divided into a plurality of stripe regions 32 with a predetermined width toward the y direction, for example. The scan operation by the image acquisition mechanism 150 is performed for each stripe region 32, for example. The scanning operation of the stripe region 32 is advanced relatively in the x direction while moving the stage 105 in the −x direction, for example. Each stripe region 32 is divided into a plurality of rectangular regions 33 toward the longitudinal direction. The movement of the beams to the target rectangular region 33 is performed by collective deflection of the entire multiple primary electron beams 20 by the main deflector 208.

Figure 9:
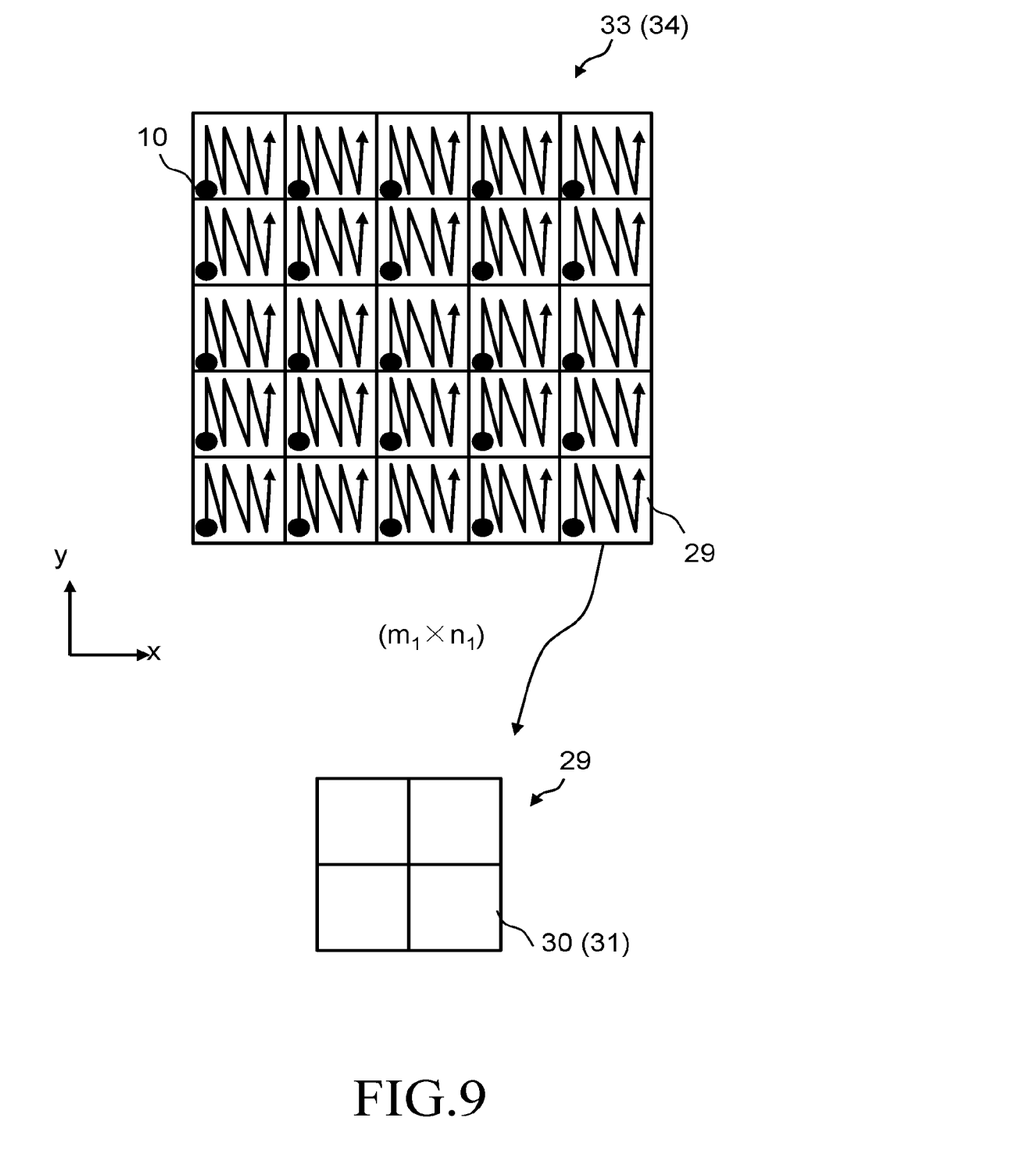
FIG. 9 is a view for describing a scan operation of multiple beams in Embodiment 1.

FIG. 9 is a view for describing the scan operation of multiple beams in Embodiment 1. The example of FIG. 9 shows a case of the multiple primary electron beams 20 of 5×5 columns. An irradiation region 34 that can be irradiated with the multiple primary electron beams 20 at a time is defined by (x direction size obtained by multiplying the inter-beam pitch in the x direction of the multiple primary electron beams 20 on the surface of the substrate 101 by the number of beams in the x direction)×(y direction size obtained by multiplying the inter-beam pitch in the y direction of the multiple primary electron beams 20 on the surface of the substrate 101 by the number of beams in the y direction). The width of each stripe region 32 is preferably set to the same size as the y direction size of the irradiation region 34 or a size narrowed by a scan margin. The example of FIG. 8 shows a case where the irradiation region 34 has the same size as the rectangular region 33. However, the present invention is not limited thereto. The irradiation region 34 may be smaller than the rectangular region 33. Alternatively, the irradiation region 34 may be larger than the rectangular region 33. A sub-irradiation region 29 surrounded by the inter-beam pitch in the x direction and the inter-beam pitch in the y direction where its own beam is positioned is irradiated with each beam of the multiple primary electron beams 20, and the inside of the sub-irradiation region 29 is scanned (scan operation). Each of the primary electron beams 10 constituting the multiple primary electron beams 20 is responsible for any of the sub-irradiation regions 29 different from one another. At the time of each shot, the same position in the sub-irradiation region 29 in charge is irradiated with each of the primary electron beams 10. The movement of the primary electron beams 10 in the sub-irradiation region 29 is performed by collective deflection of the entire multiple primary electron beams 20 by the sub-deflector 209. Such an operation is repeated to sequentially irradiate the inside of one sub-irradiation region 29 with one primary electron beam 10. When scanning of one sub-irradiation region 29 is finished, the irradiation position moves to the adjacent rectangular region 33 in the same stripe region 32 by collective deflection of the entire multiple primary electron beams 20 by the main deflector 208. Such an operation is repeated to sequentially irradiate the inside of the stripe region 32. When the scanning of one stripe region 32 is finished, the irradiation position moves to the next stripe region 32 by the movement of the stage 105 or/and collective deflection of the entire multiple primary electron beams 20 by the main deflector 208. As described above, the secondary electron image for each sub-irradiation region 29 is acquired by irradiation with each primary electron beam 10. By combining these secondary electron images for each sub-irradiation region 29, the secondary electron image of the rectangular region 33, the secondary electron image of the stripe region 32, or the secondary electron image of the chip 332 is configured.

As shown in FIG. 9, each sub-irradiation region 29 is divided into a plurality of rectangular frame regions 30, and a secondary electron image (inspected image) in units of frame region 30 is used for inspection. The example of FIG. 9 shows a case where one sub-irradiation region 29 is divided into, for example, four frame regions 30. However, the number of divisions is not limited to four. The number of divisions may be another number.

Note that the plurality of chips 332 arranged, for example, in the x direction are preferably divided as the same group into a plurality of stripe regions 32 with a predetermined width, for example, toward the y direction for each group. The movement between the stripe regions 32 is not limited to each chip 332, and may be preferably performed for each group.

Here, in a case where the substrate 101 is irradiated with the multiple primary electron beams 20 while the stage 105 continuously moves, the main deflector 208 performs a tracking operation by collective deflection so that the irradiation position of the multiple primary electron beams 20 follows the movement of the stage 105. Therefore, the emission position of the multiple secondary electron beams 300 changes from moment to moment with respect to the orbit center axis of the multiple primary electron beams 20. Similarly, when the inside of the sub-irradiation region 29 is scanned, the emission position of each secondary electron beam changes from moment to moment in the sub-irradiation region 29. The deflector 218 collectively deflects the multiple secondary electron beams 300 so as to irradiate the corresponding detection region of the multi-detector 222 with each secondary electron beam whose emission position has thus changed.

Figure 10:
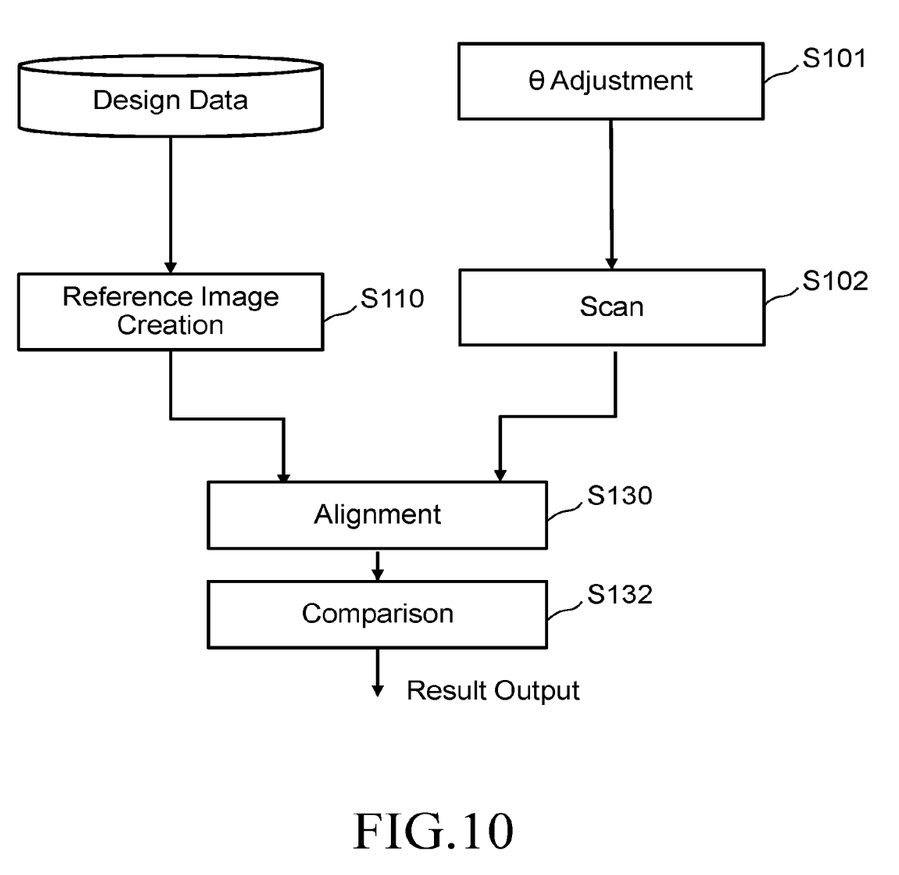
FIG. 10 is a flowchart showing a main process of an inspection method in Embodiment 1.

FIG. 10 is a flowchart showing the main process of the inspection method in Embodiment 1. In FIG. 10, the inspection method in Embodiment 1 includes a series of processes of a θ adjustment process (S101), a scan process (S102), a reference image creation process (S110), an alignment amount calculation process (S130), and a comparison process (S132).

As the θ adjustment process (S101), the substrate 101 is conveyed onto the θ stage 234 in the inspection chamber 103 by a conveyance system not illustrated. In the conveyance system not illustrated, the deviation of the arrangement angle of the substrate 101 is measured before the substrate 101 is conveyed to the inspection chamber 103. Information on the deviation of the arrangement angle is output to the stage control circuit 114. Under the control of the stage control circuit 114, the drive motor 65 moves the table 42 by an angle θ for correction in the rotational direction so as to correct the deviation of the arrangement angle. For example, the rotation angle of the substrate 101 is adjusted within an angle range of a few degrees. For example, the angle θ of the rotational direction of the substrate 101 is adjusted within a range of ±0.1°.

As the scan process (S102), the image acquisition mechanism 150 acquires an image of the substrate 101 on which a figure pattern is formed. Here, the secondary electron image of the substrate 101 is acquired by irradiating the substrate 101 on which the plurality of figure patterns is formed with the multiple primary electron beams 20 and detecting the multiple secondary electron beams 300 emitted from the substrate 101 due to the irradiation of the multiple primary electron beams 20. As described above, reflected electrons and secondary electrons may be projected onto the multi-detector 222, or the reflected electrons may diverge in the middle and the remaining secondary electrons (the multiple secondary electron beams 300) may be projected.

As described above, the multiple secondary electron beams 300 emitted from the substrate 101 due to the irradiation of the multiple primary electron beams 20 are detected by the multi-detector 222. Detection data (measurement image data: secondary electron image data: inspected image data) of secondary electrons for each pixel in each sub-irradiation region 29 detected by the multi-detector 222 is output to the detection circuit 106 in measurement order. In the detection circuit 106, analog detection data is converted into digital data by an A/D converter not illustrated and stored in the chip pattern memory 123. The obtained measurement image data is transferred to the comparison circuit 108 together with information indicating each position from the position circuit 107.

Figure 11:
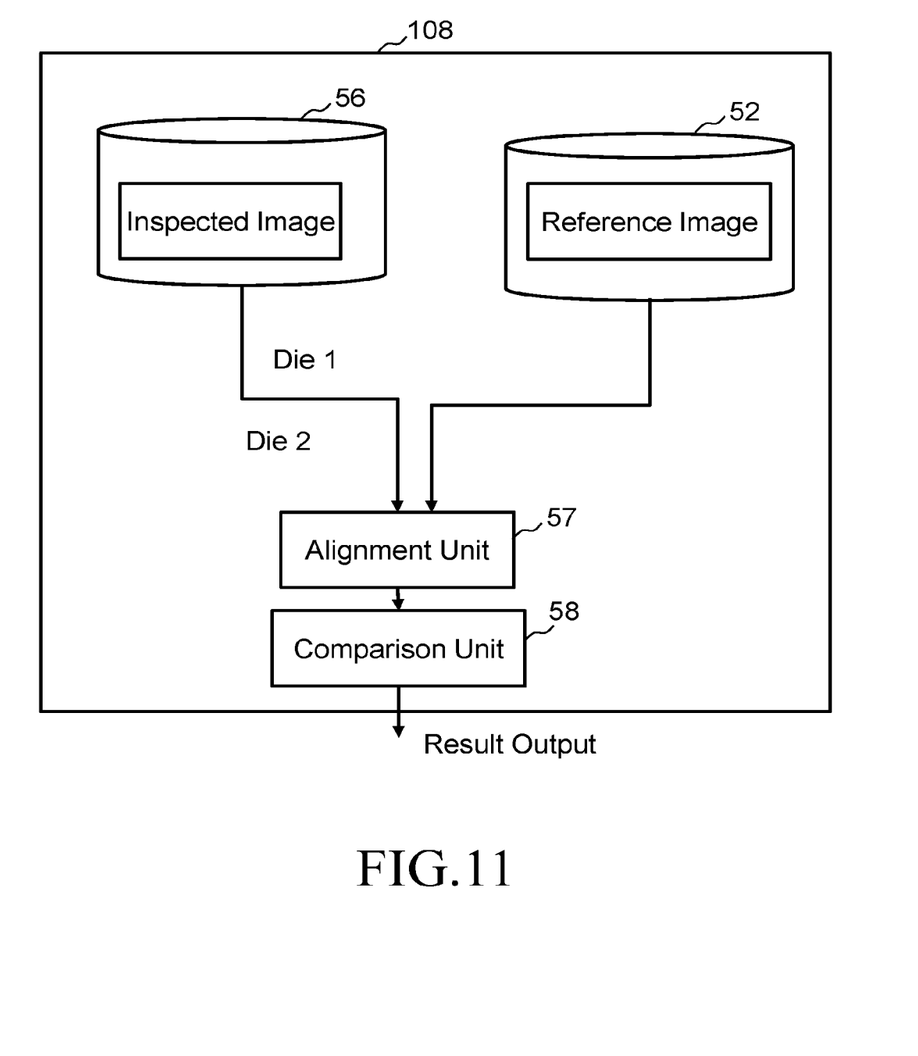
FIG. 11 is a configuration view showing an example of the configuration in a comparison circuit in Embodiment 1.

FIG. 11 is a configuration view showing an example of the configuration in the comparison circuit in Embodiment 1. In FIG. 11, storage apparatuses 52 and 56 such as magnetic disk drives, an alignment unit 57, and a comparison unit 58 are arranged in the comparison circuit 108. Each "unit" as in the alignment unit 57 and the comparison unit 58 includes a processing circuit, and the processing circuit includes an electric circuit, a computer, a processor, a circuit board, a quantum circuit, and a semiconductor device. In addition, for each "unit", a common processing circuit (same processing circuit) may be used. Alternatively, different processing circuits (separate processing circuit) may be used. Input data necessary in the alignment unit 57 and the comparison unit 58 or calculated results are stored each time in a memory not illustrated or the memory 118.

The comparison circuit 108 compares an inspected image including at least a part of the secondary electron image for each sub-irradiation region 29 with a reference image. As the inspected image, for example, a secondary electron image for each frame region 30 is used. For example, the sub-irradiation region 29 is divided into four frame regions 30. As the frame region 30, for example, a region of 512×512 pixels is used. Specifically, for example, the operation is as follows.

As the reference image creation process (S110), the reference image creation circuit 112 creates a reference image corresponding to a measurement image of each frame region based on design data that becomes a source of a plurality of figure patterns formed on the substrate 101. Specifically, the operation is as follows. First, design pattern data is read from the storage apparatus 109 through the control computer 110, and each figure pattern defined in the read design pattern data is converted into binary or multi-valued image data.

As described above, the figure defined in the design pattern data is, for example, a rectangle or a triangle as a basic figure. For example, figure data in which the shape, size, position, and the like of each pattern figure are defined by information such as coordinates (x, y) at a reference position of the figure, a length of a side, and a figure code serving as an identifier for distinguishing a figure type such as a rectangle or a triangle is stored.

When the design pattern data to be such figure data is input to the reference image creation circuit 112, the design pattern data is expanded to data for each figure, and a figure code indicating a figure shape of the figure data, a figure dimension, and the like are interpreted. The design pattern is expanded to binary or multi-valued design pattern image data as a pattern arranged in a square in units of grid of a predetermined quantization dimension, and is output. In other words, the design data is read, the occupancy of the figure in the design pattern is calculated for each square formed by virtually dividing the inspection region as a square in units of a predetermined dimension, and n-bit occupancy data is output. For example, it is preferable to set one square as one pixel. If one pixel has a resolution of $1/2^8 (=1/256)$, a small region of $1/256$ is allocated by the region of the figure arranged in the pixel, and the occupancy in the pixel is calculated. Then, it is created as 8-bit occupancy data. Such a square (inspection pixel) is only required to be matched with the pixel of the measurement data.

Next, the reference image creation circuit 112 performs filter processing on design image data of a design pattern, which is image data of the figure, by using a filter function F to which the calculated coefficient is applied. Thus, design image data that is image data on the design side in which the image intensity (gray value) is a digital value can be matched with the image generation characteristics obtained by irradiation of the multiple primary electron beams 20. The image data of the reference image having been created is output to the comparison circuit 108.

The measurement image (corrected inspected image) input into the comparison circuit 108 is stored in the storage apparatus 56. The reference image input into the comparison circuit 108 is stored in the storage apparatus 52.

As the alignment process (S130), the alignment unit 57 reads a corresponding frame image 31 (secondary electron image) and a reference image from the storage apparatus for each frame region 30, and aligns both the images in units of a subpixel smaller than the pixel. For example, the alignment may be performed by the least squares method. The pixel size is preferably set to a region having the same size as each beam size of the multiple primary electron beams 20, for example.

As the comparison process (S132), the comparison unit 58 compares the frame image (inspected image) with the reference image. The comparison unit 58 compares both for each pixel according to a predetermined determination condition, and determines the presence/absence of a defect such as a shape defect. For example, if the gradation value difference for each pixel is larger than a determination threshold Th, the presence of a defect is determined. Then, a comparison result is output. The comparison result only required to be output to the storage apparatus 109, the monitor 117, or the memory 118, or only required to be output from a printer not illustrated.

The example described above shows the case of perform die-database inspection, but the present invention is not limited thereto. Die-die inspection may be performed. When die-die inspection is performed, the following operation is performed.

As the alignment process (S130), the alignment unit 57 reads the frame image 31 (inspected image) of a die 1 and the frame image 31 (inspected image) of a die 2 on which the same pattern is formed, and aligns both the images in units of a subpixel smaller than the pixel. For example, the alignment may be performed by the least squares method.

As the comparison process (S132), the comparison unit 58 compares both images with one of the frame image 31 (inspected image) of the die 1 and the frame image 31 (inspected image) of the die 2 as a reference image. The comparison unit 58 compares both for each pixel according to a predetermined determination condition, and determines the presence/absence of a defect such as a shape defect. For example, if the gradation value difference for each pixel is larger than a determination threshold Th, the presence of a defect is determined. Then, a comparison result is output. The comparison result only required to be output to the storage apparatus 109, the monitor 117, or the memory 118, or only required to be output from a printer not illustrated.

In the above-described example, the comparison is performed using the gradation value for each pixel, but the present invention is not limited thereto. For example, a contour line of an internal figure pattern is extracted from the frame image 31. On the other hand, the contour line of the figure pattern inside the frame region 30 is extracted from a reference image or design data of the same frame region 30. The contour line of the figure pattern extracted from the frame image 31 and the contour line of the figure pattern extracted from the reference image or the design data may be compared. For example, in a case where the distance between the contour lines is larger than a determination threshold, the presence of a defect is determined.

As described above, according to Embodiment 1, it is possible to reduce the maximum displacement amount R of the surface of the substrate 101 mounted on the table 42.

In the above description, the series of "circuits" includes a processing circuit, and the processing circuit includes an electric circuit, a computer, a processor, a circuit board, a quantum circuit, and a semiconductor device. In addition, for each "circuit", a common processing circuit (same processing circuit) may be used. Alternatively, different processing circuits (separate processing circuit) may be used. The program that causes the processor to execute is only required to be recorded in a recording medium such as a magnetic disk drive, a magnetic tape apparatus, an FD, or a read only memory (ROM). For example, the position circuit 107, the comparison circuit 108, the reference image creation circuit 112, the stage control circuit 114, the lens control circuit 124, the blanking control circuit 126, the deflection control circuit 128, and the retarding potential control circuit 130 may include at least one processing circuit described above.

The embodiment has been described above with reference to specific examples. However, the present invention is not limited to these specific examples. The example of FIG. 1 shows the case where the multiple primary electron beams 20 are formed by the shaping aperture array substrate 203 from one beam with which the electron gun assembly 201 serving as one irradiation source irradiated, but the present invention is not limited thereto. The multiple primary electron beams 20 may be formed by the primary electron beams with which a plurality of irradiation sources irradiate.

While descriptions of parts not directly necessary for the description of the present invention such as an apparatus configuration and a control method are omitted, a necessary apparatus configuration and control method can be selected and used as appropriate.

In addition, all θ stage mechanisms and electron beam inspection apparatuses that include the elements of the present invention and can be appropriately modified in design by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A θ stage mechanism comprising:
a fixed shaft;
a plurality of bearings in which outer rings roll on an outer peripheral surface of the fixed shaft;
a plurality of cylindrical members supported in a state of being inserted inside inner rings of the plurality of bearings; and
a table that is arranged on the plurality of cylindrical members and moves in a rotational direction about a center of the fixed shaft by the plurality of bearings rolling on an outer peripheral surface of the fixed shaft.

2. The mechanism according to claim 1, wherein one or more bearings of the plurality of bearings are respectively fixed to the table via a cylindrical member of the plurality of cylindrical members inserted into an inner ring of the inner rings, and remaining at least one bearing is pressurized to an outer peripheral surface side of the fixed shaft via a cylindrical member of the plurality of cylindrical members inserted into an inner ring of the inner rings.

3. The mechanism according to claim 1, wherein the fixed shaft is formed into a hollow structure; and
an opening is formed in a center region of the table.

4. The mechanism according to claim 3 further comprising:
an electrode arranged above the table,
wherein wiring is connected to the electrode from outside through a hollow structure of the fixed shaft and the opening of the table.

5. The mechanism according to claim 1, wherein one bearing of the plurality of bearings is pressurized to an outer peripheral surface side of the fixed shaft via a cylindrical member of the plurality of cylindrical members inserted into an inner ring of the inner rings.

6. The mechanism according to claim 5, wherein remaining bearings of the plurality of bearings are respectively fixed to the table via a cylindrical member of the plurality of cylindrical members inserted into an inner ring of the inner rings.

7. The mechanism according to claim 3, wherein the opening is formed in a region including a rotation center of the table.

8. The mechanism according to claim 4, wherein a negative potential is applied to the electrode via the wiring.

9. The mechanism according to claim 4, wherein a substrate is arranged above the table via the electrode.

10. An electron beam inspection apparatus comprising:
a θ stage mechanism including
a fixed shaft;
a plurality of bearings in which outer rings roll on an outer peripheral surface of the fixed shaft;
a plurality of cylindrical members supported in a state of being inserted inside inner rings of the plurality of bearings; and
a table that is arranged on the plurality of cylindrical members and moves in a rotational direction about a center of the fixed shaft by the plurality of bearings rolling on an outer peripheral surface of the fixed shaft;
an electron beam column configured to irradiate a substrate arranged on the θ stage mechanism with an electron beam;
a detector configured to detect a secondary electron emitted from the substrate by irradiation of the electron beam; and
a comparison circuit configured to compare an inspected image with a reference image, a secondary electron image based on detected data being used as the inspected image.

* * * * *